United States Patent
Keeton et al.

(10) Patent No.: US 6,861,321 B2
(45) Date of Patent: Mar. 1, 2005

(54) METHOD OF LOADING A WAFER ONTO A WAFER HOLDER TO REDUCE THERMAL SHOCK

(75) Inventors: Tony J. Keeton, Mesa, AZ (US); Michael R. Stamp, Chandler, AZ (US); Mark R. Hawkins, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/118,073

(22) Filed: Apr. 5, 2002

(65) Prior Publication Data

US 2003/0190823 A1 Oct. 9, 2003

(51) Int. Cl.[7] .................................... H01L 21/336
(52) U.S. Cl. ................ 438/308; 438/792; 438/795; 118/724; 118/725; 118/727
(58) Field of Search ................ 438/308, 792, 438/795; 118/715, 724, 725, 727, 728

(56) References Cited

U.S. PATENT DOCUMENTS

| | | | |
|---|---|---|---|
| 4,116,733 A | 9/1978 | Olsen et al. | |
| 4,331,485 A | 5/1982 | Gat | |
| 5,011,794 A | 4/1991 | Grim et al. | |
| 5,033,407 A | 7/1991 | Mizuno et al. | |
| 5,080,549 A | * 1/1992 | Goodwin et al. | 414/744.8 |
| 5,199,483 A | 4/1993 | Bahng | |
| 5,203,547 A | 4/1993 | Marumo | |
| 5,230,931 A | * 7/1993 | Yamazaki et al. | 427/569 |
| 5,352,636 A | 10/1994 | Beinglass | 437/235 |
| 5,444,217 A | 8/1995 | Moore et al. | |
| 5,462,603 A | 10/1995 | Murakami | |
| 5,551,985 A | 9/1996 | Brors et al. | |
| 5,710,407 A | * 1/1998 | Moore et al. | 219/405 |
| 5,778,968 A | 7/1998 | Hendrickson et al. | |
| 5,803,977 A | 9/1998 | Tepman et al. | |
| 5,834,322 A | 11/1998 | Fusegawa et al. | |
| 5,863,843 A | * 1/1999 | Green et al. | 438/771 |
| 5,879,128 A | * 3/1999 | Tietz et al. | 414/757 |
| 5,902,407 A | 5/1999 | DeBoer et al. | |
| 5,997,588 A | 12/1999 | Goodwin et al. | |
| 6,003,527 A | 12/1999 | Netsu et al. | 134/1.3 |
| 6,053,982 A | 4/2000 | Halpin et al. | 118/728 |
| 6,068,441 A | 5/2000 | Raaijmakers et al. | |
| 6,072,157 A | 6/2000 | Klebanoff et al. | |
| 6,093,252 A | 7/2000 | Wengert et al. | 118/719 |
| 6,111,225 A | 8/2000 | Ohkase et al. | |
| 6,113,702 A | 9/2000 | Halpin et al. | 118/725 |
| 6,129,044 A | 10/2000 | Zhao et al. | 118/715 |
| 6,136,725 A | 10/2000 | Loan et al. | |
| 6,151,446 A | 11/2000 | Hunter et al. | |

(List continued on next page.)

FOREIGN PATENT DOCUMENTS

| | | | |
|---|---|---|---|
| EP | 0 445 596 A2 | 9/1991 | |
| EP | 0 553 691 A1 | 8/1993 | |
| GB | 2 181 458 A | 4/1987 | |
| JP | 03-135011 | 6/1991 | ......... H01L/21/027 |
| WO | WO 99/23691 | 5/1999 | ........... H01L/21/00 |

Primary Examiner—W. David Coleman
Assistant Examiner—Khiem Nguyen
(74) Attorney, Agent, or Firm—Knobbe, Martens, Olson & Bear, LLP

(57) ABSTRACT

One or more of three different measures are taken to preheat a wafer before it is loaded into direct contact with a wafer holder, in order to provide optimal throughput while reducing the risk of thermal shock to the wafer. The first measure is to move the wafer holder to a raised position prior to inserting the wafer into the reaction chamber and holding the wafer above the wafer holder. The second measure is to provide an increased flow rate of a heat-conductive gas (such as $H_2$ purge gas) through the chamber prior to inserting the wafer therein. The third measure is to provide a power bias to radiative heat elements (e.g., heat lamps) above the reaction chamber.

28 Claims, 4 Drawing Sheets

U.S. PATENT DOCUMENTS

| | | |
|---|---|---|
| 6,167,834 B1 | 1/2001 | Wang et al. |
| 6,183,183 B1 | 2/2001 | Goodwin et al. |
| 6,184,972 B1 | 2/2001 | Mizutani et al. |
| 6,191,399 B1 | 2/2001 | Van Bilsen |
| 6,209,220 B1 | 4/2001 | Raaijmakers |
| 6,239,038 B1 | 5/2001 | Wen ........................ 438/745 |
| 6,290,491 B1 | 9/2001 | Shahvandi et al. |
| 6,301,434 B1 * | 10/2001 | McDiarmid et al. ........ 392/416 |
| 6,306,183 B1 | 10/2001 | Fujita et al. |
| 6,342,691 B1 * | 1/2002 | Johnsgard et al. .......... 219/390 |
| 6,343,183 B1 | 1/2002 | Halpin et al. ............... 392/416 |
| 6,344,084 B1 | 2/2002 | Koinuma et al. |
| 6,365,518 B1 | 4/2002 | Lee et al. .................. 438/687 |
| 6,391,796 B1 | 5/2002 | Akiyama et al. ............ 438/763 |
| 6,403,322 B1 * | 6/2002 | Fischer .......................... 435/6 |
| 6,454,866 B1 | 9/2002 | Halpin et al. ................ 118/730 |
| 6,475,902 B1 | 11/2002 | Hausmann et al. .......... 438/627 |
| 6,491,757 B2 | 12/2002 | Halpin et al. ................ 118/666 |
| 6,521,503 B2 * | 2/2003 | Jacobson et al. ............ 438/308 |
| 6,546,820 B1 * | 4/2003 | Van et al. ................... 73/865.8 |
| 6,676,759 B1 | 1/2004 | Takagi ........................ 118/728 |
| 2001/0046768 A1 * | 11/2001 | Mezey ........................ 438/680 |
| 2002/0119641 A1 | 8/2002 | Zehavi et al. ................ 438/458 |
| 2002/0182892 A1 * | 12/2002 | Arai et al. |
| 2003/0036268 A1 | 2/2003 | Brabant et al. .............. 438/689 |
| 2003/0049580 A1 | 3/2003 | Goodman ................... 432/258 |

\* cited by examiner

METHOD OF LOADING A WAFER ONTO A WAFER HOLDER TO REDUCE THERMAL SHOCK

INCORPORATION BY REFERENCE

This application hereby incorporates by reference the entire disclosures of: (1) U.S. Pat. No. 4,821,674 to de Boer, et al.; (2) U.S. Pat. No. 6,293,749 to Raaijmakers et al.; and (3) U.S. patent application Ser. No. 09/747,173, entitled "Susceptor Pocket Profile to Improve Process Performance," filed Dec. 22, 2000.

FIELD OF THE INVENTION

This invention relates generally to the processing of wafers within semiconductor processing chambers and, more particularly, to a method of loading a wafer onto a wafer holder within a cold wall chemical vapor deposition chamber.

BACKGROUND OF THE INVENTION

High-temperature ovens, or reactors, are used to process semiconductor wafers from which integrated circuits are made for the electronics industry. A substrate, typically a circular silicon wafer, is placed on a wafer holder. If the wafer holder helps to attract heat, it is called a susceptor. The wafer and wafer holder are enclosed in a quartz chamber and heated to high temperatures, such as 600–1200° C. or even higher, by a plurality of radiant lamps placed around the quartz chamber. A reactant gas is passed over the heated wafer, causing the chemical vapor deposition (CVD) of a thin layer of the reactant material on the wafer. Through subsequent processes in other equipment, these layers are made into integrated circuits, with a single layer producing from tens to thousands of integrated circuits, depending on the size of the wafer and the complexity of the circuits. In recent years, single-wafer processing has grown for a variety of reasons, including its greater precision as opposed to processing batches of wafers at the same time, while larger diameter wafers are employed to compensate for reduced throughput as compared to batch processing.

Typically, a wafer is inserted into a reaction chamber through the use of a robotic end effector. In one arrangement, the end effector comprises a Bernoulli wand, which operates on the Bernoulli principle; it provides a plurality of relatively high velocity gas flow streams above the wafer, creating a pressure drop across the wafer to draw it upward toward the wand. The jet streams are normally angled slightly downward to prevent direct contact between the wafer and the wand. A typical gas for use within a Bernoulli wand is $N_2$. The Bernoulli wand includes a lower wand foot that prevents the wafer from flowing laterally away from the wand, the wand foot normally extending downwardly below the lower surface of the wafer. The Bernoulli wand typically centers the wafer above the wafer holder and then either lowers the wafer onto the wafer holder or permits the wafer to drop thereon. The wafer holder may include a pocket or recess designed to receive the wafer. The top surface of the pocket of the wafer holder may include grooves to permit gas between the wafer and the wafer holder to escape around the edges of the wafer. Such grooves help to prevent the wafer from sliding horizontally with respect to the wafer holder.

In another arrangement, the robotic end effector comprises a forked member that supports the lower surface of the wafer only at the wafer's outer edges. Such an end effector is shown, for example, in U.S. Pat. No. 6,293,749 to Raaijmakers et al. In that invention, the end effector includes two arms that define an inner clearance wide enough to accommodate the vertical movement of an inner wafer holder section. Wafer loading is accomplished by supporting the wafer on the end effector, moving the inner wafer holder section vertically through the clearance defined by the two arms of the end effector to lift the wafer thereabove, withdrawing the end effector from the reaction chamber, and then lowering the inner wafer holder section. Alternatively, lift pins may be vertically raised to receive the wafer from the fork-type end effector.

Various CVD process parameters must be carefully controlled to ensure the high quality of the resulting semiconductor. One such critical parameter is the temperature difference between the wafer and the wafer holder as the former is loaded onto the latter. As explained above, CVD processing often occurs at temperatures of 600–1200° C. or even higher. A common problem associated with CVD processing is "thermal shock," which can result in wafer "curl" or "pop." When a relatively cold (e.g., room temperature) wafer is loaded onto the top surface of a relatively hot (e.g., 600° C. or higher) wafer holder, the wafer can experience thermal shock due to thermal gradients within the wafer, caused by sudden conductive heat transfer from the wafer holder to the wafer. These thermal stresses can cause the wafer to curl, i.e., to deform by bending, often decentering the wafer relative to the wafer holder. In extreme cases, the wafer may pop, which can cause the wafer to jump out of the pocket of the wafer holder and possibly damage the end effector. Contact between the wafer and the end effector can also damage the wafer topside and/or cause particles to flake off of the wafer and contaminate the chamber. Thermal shock can also result in crystallographic slip. Slip is a defect in the crystalline structure of the wafer, which destroys any devices through which it may pass. Curl, pop, and slip typically degrade the performance of the wafer (e.g., increased device and current leakage) and can even render the wafer unusable.

Several methods can be employed to reduce thermal shock. One solution is to reduce the temperature of the reaction chamber and wafer holder prior to the insertion of each new wafer. In this method, the temperature of the wafer holder is reduced to a level such that the wafer is unlikely to curl when it is brought into contact with the wafer holder. Once the wafer is loaded, the temperature of the reaction chamber, including the wafer holder and wafer, is steadily increased to a desired processing temperature. While this method of controlling the temperature of the reaction chamber can prevent thermal shock, it significantly reduces throughput, as it is very time consuming to continually vary the temperature of the reaction chamber between the higher processing temperature and the lower temperature at which thermal shock is substantially prevented. Since reduction in throughput results in lower production and higher production costs, this method of reducing thermal shock is rarely used in practice.

Another solution for preventing thermal shock is to gradually preheat the wafer before it is brought into contact with the wafer holder. Typically, the wafer is inserted into a preheated reaction chamber and, for some time, held above the wafer holder without any contact therebetween. While positioned above the wafer holder, the wafer receives heat in the form of radiation from the lamps surrounding the reaction chamber and convection from warm gas within the chamber. The wafer is maintained in such position until the wafer temperature rises to a level at which thermal shock is unlikely to occur should the wafer be lowered onto the wafer holder. Once the wafer reaches that temperature, the wafer is lowered onto the wafer holder. This method is disclosed in co-pending U.S. patent application Ser. No. 09/840,532, entitled "High-Temperature Drop-off of a Substrate," filed Apr. 23, 2001.

In one method of preheating a wafer, the wafer is held above the wafer holder by a robotic end effector for a few seconds before being dropped onto the wafer holder. In another method, the wafer is held above the wafer holder by a plurality of vertically movable lift pins arranged about the circumference of the wafer. The lift pins typically provide support to the wafer at three or more positions near the wafer's outer radial periphery. The lift pins have a raised position in which the wafer does not contact the wafer holder and a lowered position in which the wafer rests upon the wafer holder. When the wafer is inserted into the reaction chamber, the lift pins are raised so that the wafer does not contact the wafer holder. Once the wafer temperature increases sufficiently, the lift pins are lowered so that the wafer is brought into contact with the wafer holder.

After a wafer is processed and removed from a reaction chamber and before a new wafer is inserted therein for processing, a purge gas such as $N_2$, $H_2$, or noble gas is typically directed through the chamber. The purge gas helps to prevent particles that may be present in the wafer handling chamber and other areas from entering and possibly contaminating the reaction chamber. The purge gas also prevents undesired oxidation on the surface of a wafer as it is inserted into the reaction chamber.

SUMMARY OF THE INVENTION

Despite these efforts to preheat the wafer prior to loading it onto the wafer holder, it has been found that the problems associated with thermal shock persist, especially for wafer holders having particular geometries. Wafer holders configured to produce a larger surface area of contact with the wafer have been found more likely to cause the aforementioned problems associated with thermal shock. A larger surface area of contact results in greater temperature gradients within the wafer. The present invention satisfies an existing need for a wafer-loading method that substantially reduces the likelihood of thermal shock regardless of wafer holder geometry.

The invention provides at least three measures to improve preheating of the wafer before it is brought into direct contact with the wafer holder. These three measures can be implemented singly or in any desired combination. Preferably, all three measures are taken together. The first measure is to move the wafer holder (or at least a significant portion thereof) to a position closer to the wafer during or before loading. This reduces the heat flux path from the wafer holder to the wafer, thereby speeding up the preheating process. The second measure is to provide an increased rate of flow of heat-conductive gas (such as $H_2$ purge gas) through the chamber prior to and/or during wafer-loading. This increases convective heat transfer to the wafer. The third measure is to provide a power bias to radiation heat elements (e.g., heat lamps) on the wafer side (as opposed to the wafer holder side) of the reaction chamber. This helps to balance the heat flow to the upper and lower surfaces of the wafer, especially in view of the increased heat flow to the surface of the wafer that faces the wafer holder, which is caused by moving the wafer holder closer to the wafer. Such balancing of the heat flow reduces the likelihood of wafer curl while the wafer is near the wafer holder. The power bias to the lamps on the wafer side also helps to increase the temperature of the heat-conductive gas, for improved wafer preheating. This is so because the heat-conductive gas is normally flown primarily on the wafer side of the wafer holder. These three measures, taken especially in combination, provide faster preheating of the wafer and thereby improve throughput.

In accordance with one aspect, the present invention provides a method of loading a wafer onto a wafer holder within a reaction chamber, in which the wafer holder initially has a higher temperature than the wafer. At least a portion of the wafer holder has a lowered position and a raised position. An upper surface of the at least a portion of the wafer holder has a surface area greater than 25% of the surface area of a lower surface area of the wafer. According to the method, a flow of heat-conductive gas is provided within the reaction chamber. The at least a portion of the wafer holder is moved to its raised position, and the wafer is inserted into the reaction chamber. The wafer is held above the at least a portion of the wafer holder in its raised position while the heat-conductive gas flows within the reaction chamber. The wafer is held in this position for a time period sufficient to permit the wafer temperature to increase to a level sufficient to substantially reduce the likelihood that the wafer will curl or pop if the wafer is lowered onto the at least a portion of the wafer holder. After the time period has elapsed, the wafer is lowered onto the at least a portion of the wafer holder.

In accordance with another aspect, the present invention provides a method of loading a wafer onto a wafer holder within a reaction chamber, in which the wafer holder initially has a higher temperature than the wafer. According to the method, radiant heat is provided to the reaction chamber from at least one lamp above the reaction chamber. A flow of heat-conductive gas is provided within the reaction chamber at a first flow rate. A wafer is inserted into the reaction chamber. The wafer is held above the wafer holder while the radiant heat is being provided to the reaction chamber and while the heat-conductive gas flows therein. The wafer is held in this position for a time period sufficient to substantially reduce the likelihood of wafer curl or pop if the wafer is loaded into direct contact with the wafer holder. The wafer is then lowered onto the wafer holder. After the wafer is lowered onto the wafer holder, the flow of the heat-conductive gas is decreased to a second flow rate at least 50% less than the first flow rate.

In accordance with yet another aspect, the present invention provides a method of loading a wafer onto a wafer holder within a reaction chamber, in which the wafer holder initially has a higher temperature than the wafer. According to the method, power is provided at a fixed rate to an array of lamps generally centered above the reaction chamber and above the wafer holder. Simultaneously, power is provided at a substantially lower rate to other lamps outside of the reaction chamber. The lamps transmit radiant heat to the reaction chamber. A flow of heat-conductive gas is provided within the reaction chamber. A wafer is inserted into the reaction chamber. The wafer is held above the wafer holder during said steps of providing power and providing a flow of heat-conductive gas. The wafer is held in such position for a time period sufficient to permit the wafer temperature to increase to a level sufficient to substantially reduce the likelihood of thermal shock to the wafer if the wafer is lowered onto the wafer holder. The wafer is then lowered onto the wafer holder.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

DETAILED DESCRIPTION OF THE PREFERRED EMBODIMENT

As explained above, prior art methods for preheating a wafer as it is loaded into a reaction chamber are often too slow to result in optimal throughput. On the other hand, direct loading of a cold wafer onto a hot wafer holder, while less time-consuming, can result in thermal shock. The present invention provides a middle ground between these avenues, resulting in optimal throughput while substantially preventing thermal shock.

Figure 1:
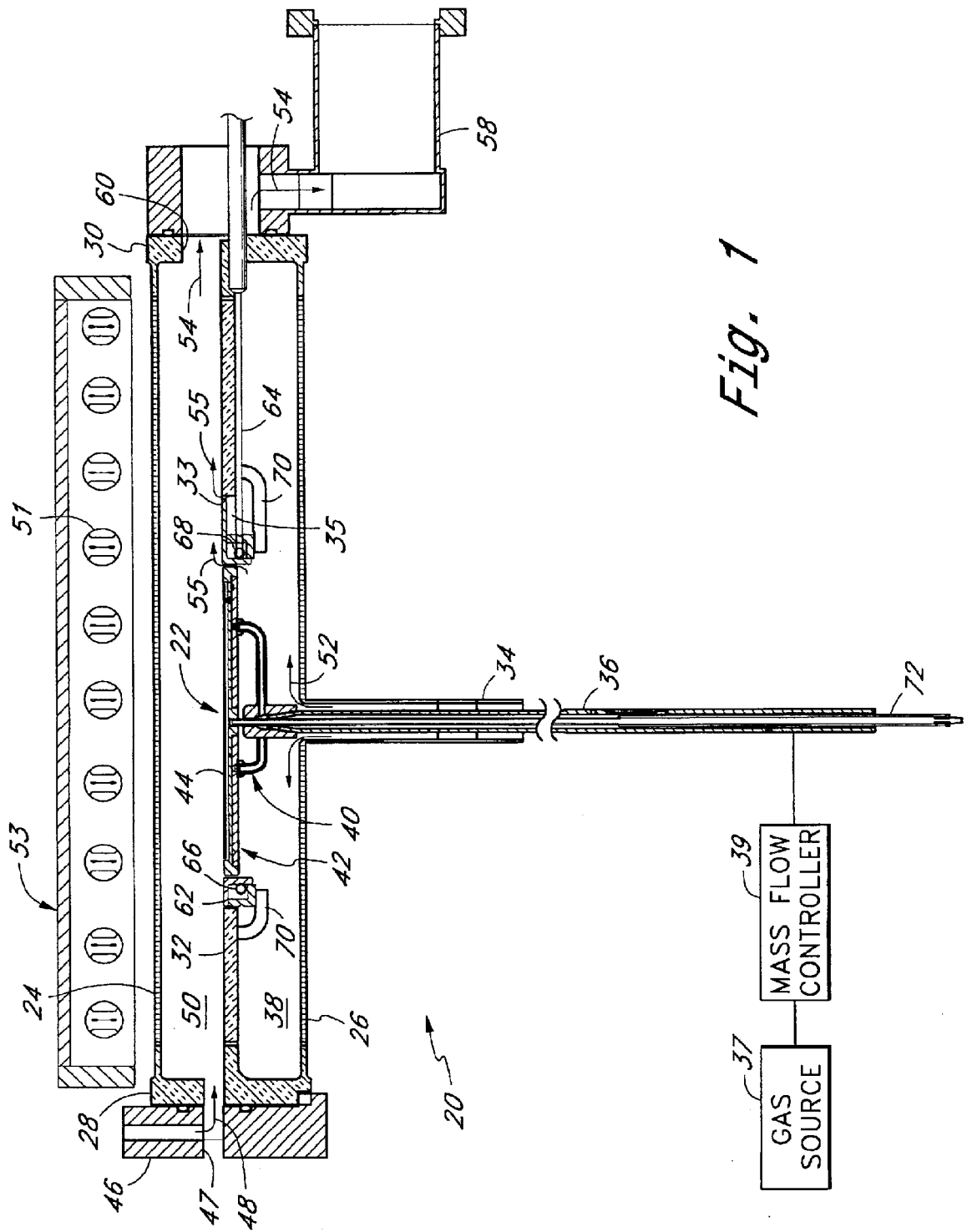
FIG. 1 is a schematic, cross-sectional view of an exemplary reaction chamber within which a wafer can be loaded onto a wafer holder in accordance with the methods of the present invention.

The present invention includes methods of preheating and loading a semiconductor wafer onto a wafer holder inside a reaction chamber. FIG. 1 illustrates one type of reaction chamber within which a wafer can be loaded according to the invention. However, the skilled artisan will understand from the teachings herein that the methods of the invention can be employed for many different types of wafer holders and reaction chambers. The discussion herein should not be limited to one particular type of reaction chamber or wafer holder. Moreover, while illustrated in the context of standard silicon wafers, the invention described herein can be used to load other kinds of substrates, such as glass, which are subjected to high temperature treatments such as CVD, physical vapor deposition (PVD), etching, annealing, dopant diffusion, photolithography, etc. The methods of the invention are of particular utility for loading substrates for processing at elevated temperatures, and even more particularly for processes in which relatively cold wafers (e.g., room temperature) are loaded onto hot relatively (e.g. 600° C. or higher) wafer holders. As used herein, the terms "substrate" and "wafer" have the same meaning.

FIG. 1 illustrates one type of cold wall reaction chamber 20 into which a semiconductor wafer can be loaded according to the methods of the present invention. Prior to discussing the details of the invention, the elements of the reaction chamber 20 will be described. The chamber 20 includes a wafer holder in the form of a susceptor system 22. While FIG. 1 illustrates a susceptor, other types of wafer holders can alternatively be used. The chamber 20 comprises a quartz tube defined by an upper wall 24, a lower wall 26, an upstream flange 28, and a downstream flange 30. Although not shown in the figure, lateral edges of the reaction chamber 20 include relatively thick side rails between which a chamber divider plate 32 is attached. FIG. 1 is a longitudinal cross-section along a central vertical plane of the chamber 20 illustrating its vertical dimension; the side rails are thus not seen. Preferably, the chamber 20 is manufactured from quartz. The chamber divider plate 32 reinforces the chamber 20 during vacuum processing and extends between the side rails (not shown), preferably along the centerline of the chamber 20. The divider plate 32 includes an aperture 33 defining a void or opening 35 extending across the lateral dimension of the chamber 20 between the side rails. The aperture 33 divides the divider plate 32 into an upstream section extending from the upstream flange 28 to an upstream edge of the aperture 33, and a downstream section extending from a downstream edge of the aperture to the downstream flange 30. The upstream section of the divider plate 32 is preferably shorter in the longitudinal direction than the downstream section.

An elongated tube 34 depends from a centrally located region of the lower wall 26. A drive shaft 36 extends through the tube 34 and into a lower region 38 of the chamber 20. The lower region 38 is defined between the central chamber divider plate 32 and the lower wall 26. The upper end of the drive shaft 36 is tapered to fit within a recess of a multi-armed support or spider assembly 40 for rotating a susceptor 42. The susceptor 42 supports a wafer 44. A motor (not shown) drives the shaft 36 to, in turn, rotate the susceptor system 22 and wafer 44 loaded thereon within the aperture 33. A gas injector 46 introduces process gas, as indicated by arrow 48, into an upper region 50 of the chamber 20. The upper region 50 is defined between the upper wall 24 and the chamber divider plate 32. The process gas passes over the top surface of the loaded wafer 44 to conduct processing (e.g., deposition) thereon. The system typically includes a plurality of radiant heat lamps arrayed around the outside of the reaction chamber 20 for heating the wafer 44 and catalyzing the chemical reactions thereon. An upper bank of elongated heat lamps 51 is illustrated outside of the upper wall 24, and typically a lower bank of lamps (not shown) arranged cross-wise to the upper bank is also utilized. Further, an array of spot lamps directed upward from underneath the susceptor 42 is often used.

In one embodiment, the susceptor system includes a means for providing gas flow to the wafer underside, to prevent backside deposition of process gases. In the illustrated embodiment, a source of gas 37 is schematically shown connected through a mass flow controller 39 to the drive shaft 36. This gas source is preferably provided with the ability to control the temperature of the gas via heaters or the like, which are not depicted in the figure. Gas flows into the space within the hollow shaft 36 and is eventually directed upward through the susceptor 42, as will be more fully described below. The fluid coupling that allows gas to flow into the hollow, rotating shaft 36 is not shown, but may be accomplished by a number of different means, one of which is shown and described in U.S. Pat. No. 4,821,674.

A wafer 44 can be inserted into the reaction chamber 20 through a wafer entry port 47. The wafer is typically transported by a robotic pick-up arm having an attached end effector (not shown), which enters through the port 47 and extends over the wafer support system 22 to deposit the wafer thereon. The end effector of the preferred embodiment is a Bernoulli wand, as described in the Background section above. After the robot pick-up arm is retracted from the reaction chamber 20, the CVD system then seals the chamber and introduces process gas for depositing a layer of silicon or other material on the wafer. After processing, a gate valve opens and the robot pick-up arm enters through the port 47 and retracts the wafer from the susceptor 42. Preferably, the reaction chamber 20 is periodically conditioned for subsequent processing. A typical conditioning sequence comprises the introduction of an etch gas into the reaction chamber with the gate valve closed to clean any particular deposition from the support structures and interior walls. After the etching, a silicon precursor is sometimes introduced into the chamber to provide a thin coat of silicon on the susceptor 42. Such a coating step is sometimes termed "capping" and serves to stabilize emissivity of the susceptor over repeated deposition cycles. After the etching and capping steps, the chamber 20 is purged with hydrogen for introduction of the next wafer.

The tube 34 is sized slightly larger than the drive shaft 36 to provide space there between through which purge gas 52 flows. The purge gas enters the lower region 38 of the reaction chamber 20 to help prevent reactant gas from depositing in the lower region. In this respect, the purge gas 52 creates a positive pressure below the wafer support system 22, which helps prevent reactant gas from traveling around the sides of the susceptor 42 in the lower region 38. The purge gas is then exhausted, as indicated with arrows 54 and 55, between the susceptor 42 and aperture 33 into the upper region 50 and then through an elongated slot 60 in the downstream flange 30. This ensures that reactant gases do not migrate into the lower region 38. The purge gas continues through an exhaust system 58. Any excess reactant gas and reaction by-product likewise passes through the elongated slot 60 in the downstream flange 30 to be vented through the exhaust system 58.

Preferably, a temperature compensation ring 62 surrounds the wafer support system 22. The ring 62 fits in the opening 35 created by the aperture 33 in the divider plate 32, and the wafer support system 22 and ring 62 together substantially fill the opening and provide structure between the lower and upper chamber regions 38, 50. The susceptor 42 rotates within the ring 62 and is preferably spaced therefrom across a small annular gap of between 0.5 and 1.5 mm. In the case of a ring 62 having a circular outer periphery, the shape of the aperture 33 in the divider plate 32 surrounding the ring 62 can be made circular so that the edges of the opening 35 are in close proximity to the ring. Alternatively, the ring 62 may have a rounded rectangular outer periphery. As will be described in greater detail below, the susceptor 42 is preferably manufactured to have a constant outer diameter to fit within the ring 62. Although the susceptor 42 has a constant outer diameter, it will be seen that various configurations are provided for processing a number of different size wafers.

In a particularly advantageous embodiment, the temperature compensation ring 62 comprises a two-part circular ring having a cavity therein for receiving thermocouples 64. In the illustrated embodiment, the thermocouples 64 enter the chamber 20 through apertures formed in the downstream flange 30 and extend underneath the divider plate 32 into the temperature compensation ring 62. The apertures in the quartz flange 30 substantially prevent gas leakage around the thermocouples 64, although typically no additional seal is used. There are preferably three such thermocouples, one 66 terminating at a leading edge, one 68 terminating at a trailing edge, and one (not shown) terminating at either of the lateral sides of the ring 62. The thermocouples within the ring 62 surrounding the susceptor 42 provide good temperature information feedback for accurate control of the radiant heating lamps. A plurality of bent fingers 70 attached to the divider plate 32 support the ring 62 around the periphery of the susceptor 42. In addition to the temperature compensation ring 62 and thermocouples therein, a central thermocouple 72 extends upward through the drive shaft 36, which is constructed hollow, and through the spider assembly 40 to terminate underneath the center of the susceptor 42. The central thermocouple 72 thus provides an accurate gauge of the temperature near the center of the wafer 44.

In addition to housing the thermocouples 64, the temperature compensation ring 62 absorbs radiant heat during high temperature processing. This compensates for a tendency toward greater heat loss at the wafer edge, a phenomenon that is known to occur due to a greater concentration of surface area for a given volume near such edges. By minimizing edge losses and the attending radial temperature non-uniformities across the wafer, the temperature compensation ring 62 can help to prevent crystallographic slip and other problems associated with temperature non-uniformities across the wafer. The temperature compensation ring 62 can be suspended by any suitable means. For example, the illustrated temperature compensation ring 62 rests upon elbows 70, which depend from the quartz chamber dividers 32.

Figure 2:
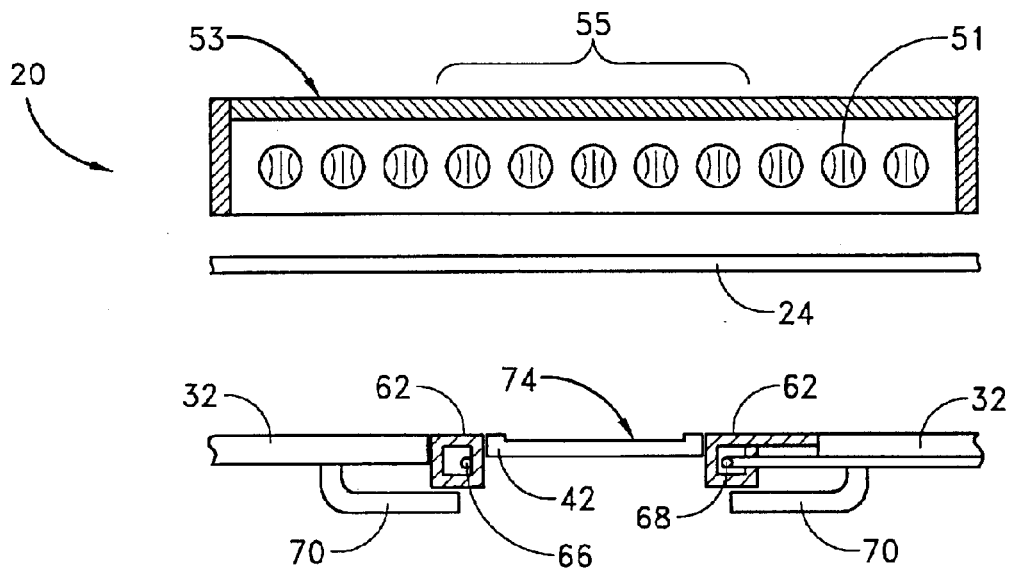
FIGS. 2–7 are schematic, cross-sectional views of a portion of the reaction chamber of FIG. 1, illustrating a method of loading a wafer onto a wafer holder in accordance with a preferred embodiment of the present invention.

FIGS. 2–7 are schematic, cross-sectional views of a portion of the reaction chamber 20 of FIG. 1, illustrating a preferred method of loading the wafer 44 onto the wafer support system 22. FIG. 2 illustrates the state of the reaction chamber prior to the loading of a wafer for processing. For simplicity, FIG. 2 shows only the upper array 53 of lamps 51, the upper quartz wall 24 of the reaction chamber, and the susceptor 42 of the susceptor system 22 (FIG. 1). In the illustrated embodiment, the susceptor 42 comprises a single unitary piece. The susceptor 42 preferably has a lowered position and a raised position. In FIG. 2, the susceptor 42 is shown in its lowered position. In another embodiment, the susceptor includes two or more portions, at least one of the portions being vertically movable to have a lowered position and a raised position. One example of a susceptor having such a configuration is disclosed in U.S. Pat. No. 6,293,749 to Raaijmakers et al. In that invention, the susceptor includes an inner portion and an outer portion, the former being vertically movable with respect to the latter. Referring to FIG. 2, the upper surface of the susceptor 42 (or, if the susceptor comprises multiple portions, the upper surface of the vertically movable portion of the susceptor) has a surface area preferably greater than 25%, more preferably greater than 50%, and even more preferably greater than 75% of the surface area of the lower surface 82 (FIG. 4) of the wafer 44.

This configuration provides for a sufficiently reduced heat flux path between the susceptor and the wafer, when the susceptor (or, if the susceptor comprises multiple portions, the vertically movable portion) occupies its raised position. In contrast, if the surface area of the upper surface of the susceptor (or the vertically movable portion thereof) were too small, then the lower surface of the wafer 44 would receive less heat from the susceptor, resulting in less effective preheating of the wafer. The raising and lowering of the susceptor to effect preheating of the wafer is discussed below. Preferably, substantially the entire upper surface of the susceptor (or the vertically movable portion thereof) is configured to contact the lower surface of the wafer 44.

In the illustrated embodiment, the susceptor 42 has a wafer-receiving recess 74 sized and configured to receive a wafer of a given size. The recess 74 is defined by a circular shoulder 47 having an upper surface 45. The recess 74 has an inner pocket surface 43. The skilled artisan will understand that many different types of susceptors can be used, including those without wafer-receiving recesses. For example, one type of susceptor that can be used in conjunction with the methods of the present invention is that which is disclosed in U.S. patent application Ser. No. 09/747,173, entitled "Susceptor Pocket Profile to Improve Process Performance," filed Dec. 22, 2000. That particular susceptor includes grid grooves in its upper surface. The grid grooves permit a degree of gas flow between the wafer holder and the wafer, which helps to prevent the wafer from sticking to the wafer holder.

With continued reference to FIG. 2, it is preferred in the present invention to provide more power to the upper lamp array 53 than to other lamps surrounding the reaction chamber 20, in order to transfer greater heat to the upper surfaces of the wafer and susceptor and to the heat-conductive gas (discussed below) in the upper region 50 of the reaction chamber. For many CVD processes, the reaction chamber 20 is ordinarily under "closed loop temperature control," whereby the power to the lamps 51 is controlled based upon feedback signals from the thermocouples in the reaction chamber, including the thermocouples 66 and 68. Existing control systems typically impose a minimum power requirement to most or all of the individual lamps surrounding the reaction chamber, which limits the overall power to the upper lamp array 53. Therefore, in the preferred embodiment of the invention, prior to or during the insertion of a new wafer into the reaction chamber 20, the chamber is switched from closed looped temperature control to "fixed power mode," with a power bias to the upper lamp array 53. In fixed power mode, power is provided to the lamps at a fixed rate. Fixed power is preferred because it effects a known lamp condition (i.e., known power output) and permits the application of greater overall power to the upper lamp array 53, as compared to the power provided to the lamps below and on the sides of the reaction chamber. Also, the power bias to the upper lamp array 53 helps to preheat the upper quartz wall 24 of the reaction chamber 20. This in turn provides for greater heat transfer to the heat-conductive gas in the upper region 50 and faster preheating of the wafer. In fixed power mode, the chamber temperature generally does not deviate too far from the closed loop temperature control setting. Switching to fixed power mode is a very efficient method of maximizing heat transfer to the wafer without drastically increasing chamber temperature.

Preferably, within the upper lamp array 53 a power bias is provided to an upper center zone 55 of the upper lamp array 53. In other words, the lamps comprising the center zone 55 preferably receive more power than the other lamps within the upper lamp array 53. The upper center zone 55 can comprise any number of the upper array of lamps 51. Preferably, the upper center zone 55 is centered directly above the susceptor 42. Also, the zone 55 is preferably coextensive with the susceptor 42. The power bias to the lamps of the zone 55 helps to ensure that the majority of lamp power is directed to the top surface of the wafer when it is loaded into the reaction chamber, as discussed below.

In a preferred embodiment of the present invention, after a wafer is processed and removed from the chamber, a heat-conductive gas is introduced into the chamber. Preferably, the heat conductive gas is $H_2$, which also serves as a purge gas. However, it will be understood that other gases may be provided, keeping in mind the goals of reducing contamination of the reaction chamber, reducing oxidation on the surface of the wafer, and accentuating convective heat transfer. As known in the art, the heat-conductive gas is preferably provided both before a new wafer is loaded onto the susceptor 42, and then subsequently during wafer processing as well.

According to the invention, before the new wafer is loaded into direct contact with the susceptor 42, the heat-conductive gas is preferably provided at a first flow rate, which is greater than that at which the gas is provided subsequently during wafer processing. This "first" or "increased" flow rate is characterized as being greater than the normal or ordinary flow rate at which a heat-conductive purge gas is used during wafer processing. The increased flow rate of heat-conductive gas provides enhanced convective heat transfer to the new wafer before it is loaded onto the susceptor 42. Preferably, the increased flow rate of heat-conductive gas is provided before a new wafer is inserted into the reaction chamber, either before or after the susceptor 42 is moved to its raised position. In the illustrated single-wafer horizontal laminar flow reactor, an $H_2$ gas flow is preferably provided at a first or increased flow rate of 20–100 slm, and more preferably 40–60 slm. If the flow rate is too high, the gas can undesirably cool the wafer's leading edge, because the gas does not have enough time to rise to a steady state temperature before it hits the front of the wafer. On the other hand, if the flow rate is too low, and if a Bernoulli wand is used with $N_2$ gas, then the concentration of $N_2$ gas might become high enough to hinder convective heat transfer to the wafer. This is because $N_2$ gas will generally be less heat-conductive than the heat-conductive gas, such as $H_2$ gas. Of course, this is of no concern where the end-effector is of a type other than a Bernoulli wand, such as the fork-type end effector described in U.S. Pat. No. 6,293,749, and also described above in the Background section.

Figure 6:
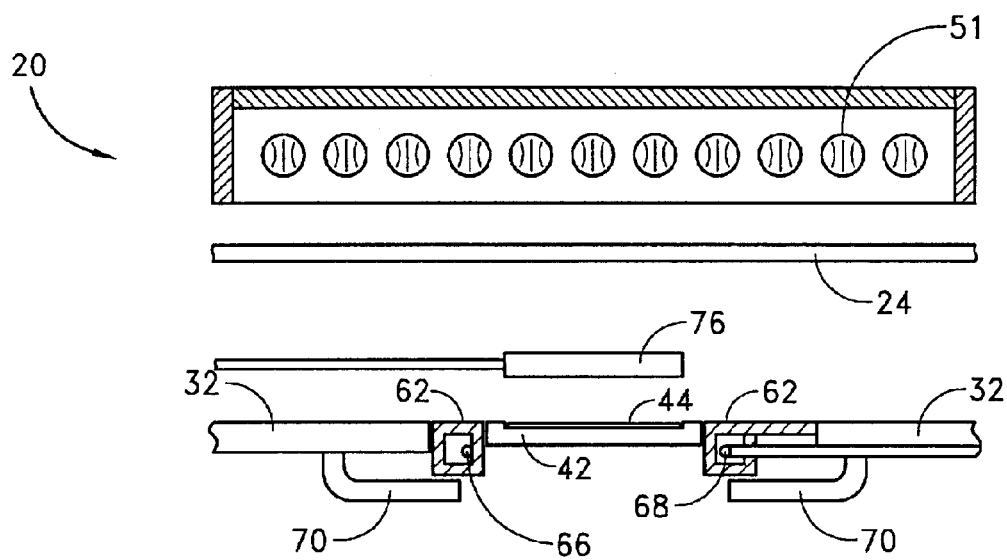

After the new wafer is loaded into direct contact with the susceptor (as shown in FIG. 6), the flow rate of the heat-conductive gas is preferably reduced to the normal or ordinary level—the "second" or "reduced" flow rate. Preferably, the second flow rate is at least 20–80%, and more preferably about 50% less than the first flow rate.

Figure 3:
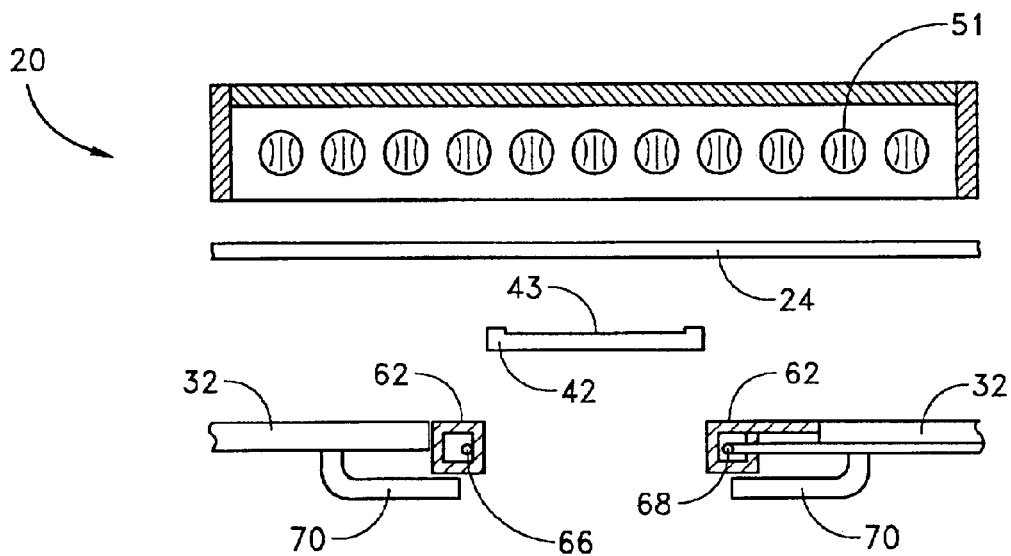

According to a preferred embodiment of the invention, prior to or during the insertion of a new wafer into the reaction chamber, the susceptor 42 is moved from its lowered position to its raised position, as illustrated in FIG. 3. In the illustrated embodiment, with reference to FIG. 1, it will be understood that the entire susceptor system 22, including the spider assembly 40, the tube 34, and the drive shaft 36, will move vertically with the susceptor 42. In its raised position, the susceptor 42 is preferably very close to the position of the bottom surface 82 (FIG. 4) of the wafer 44 when the wafer is subsequently inserted into the reaction chamber 20. Preferably, the system is designed so that the upper surface 45 of the susceptor shoulder 47 is as close as possible to the lower surface of the wafer without impeding movement of the wafer and/or robotic end effector.

In one embodiment, in which a Bernoulli wand is utilized, the raised position of the susceptor 42 is such that the upper surface 45 of the susceptor shoulder 47 is preferably about 0.127–0.560 mm, more preferably about 0.127–0.381 mm, and even more preferably about 0.127 mm or 0.254 mm from the position at which the lower surface of the wand foot of the Bernoulli wand will be when the wafer is subsequently inserted into the reaction chamber 20. Typically, the wand foot extends about 0.762 mm below the bottom surface 82 of the wafer 44. In such an embodiment, if the top surface 45 of the susceptor shoulder 47 is about 0.127–0.381 mm from the bottom surface of the wand foot, then the bottom surface 82 of the wafer 44 is about 0.889–1.143 mm from the top surface 45 of the susceptor shoulder. Alternatively, it will be understood that if the system includes a fork-type end effector and susceptor system (described both in U.S. Pat. No. 6,293,749 and in the Background section above) instead of a Bernoulli wand, then the upper surface of the inner susceptor section can be brought much closer to the bottom surface 82 of the wafer 44. In fact, since the inner susceptor section cannot contact the fork-type end effector, the inner susceptor section can be brought to within any desired distance from the wafer. In any case, the bottom surface 82 of the wafer 44 is preferably within about 1.300 mm, more preferably within about 1.200 mm, and more preferably within about 0.889 mm from an upper surface of the susceptor, such as the top surface 45 of the illustrated susceptor shoulder 47.

Figure 4:
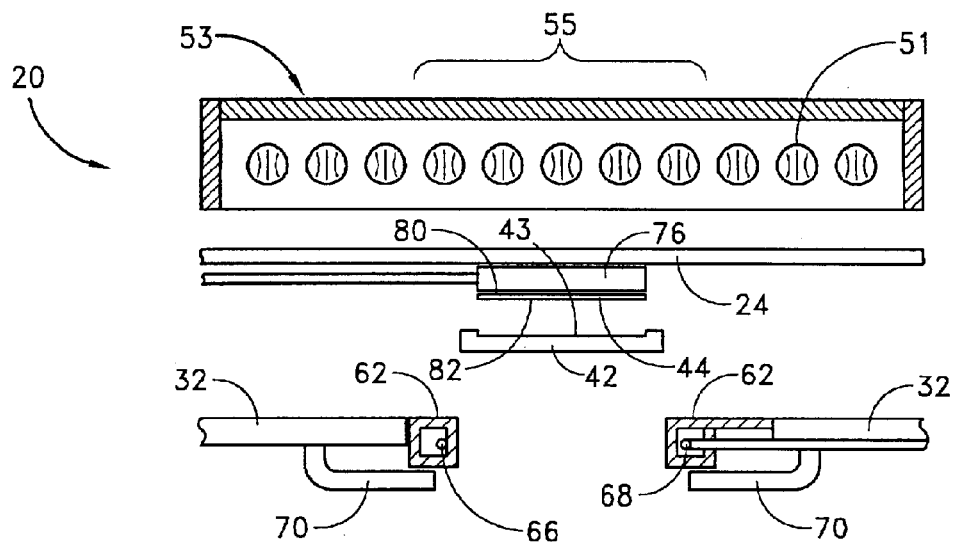

With reference to FIG. 4, with the susceptor 42 in its raised position, a new wafer 44 is inserted into the reaction chamber 20 by the use of a robot end-effector, such as a paddle, fork, vacuum wand, or Bernoulli wand. In the illustrated embodiment, a Bernoulli wand 76 is used, which is preferably formed of quartz or other material transparent to radiant energy from the lamps 51. The skilled artisan will understand that the process steps depicted in FIGS. 3 and 4 can be reversed or simultaneous. In other words, the wafer 44 can be inserted into the reaction chamber before or during the raising of the susceptor 42. Preferably, in the position shown in FIG. 4, a power bias is provided to the lamps 51 of the center zone 55 of the upper lamp array 53, and the heat-conductive gas is provided at the first or increased flow rate, as explained above.

In the prior art, in some cases, wafers have been found to curl while held above a wafer holder. This results from an imbalance in heat absorption between the wafer's upper and lower surfaces. In particular, the wafer's upper surface tends to absorb more heat than the wafer's lower surface. This is because the wafer's upper surface absorbs heat in the form of radiation directly from the heat lamps above the reaction chamber, while the wafer holder, positioned between the wafer's lower surface and the heat lamps below the reaction chamber, limits the radiative heat absorbed by the wafer's lower surface. The present invention satisfies an existing need for a wafer-loading method that generally balances heat absorption by the wafer's upper and lower surfaces.

In the position shown in FIG. 4, the upper surface 80 of the wafer receives heat in the form of radiation from the upper lamp array 53. It will be understood that if a power bias is provided to the upper center zone 55, then most of the radiative heat absorbed by the upper surface 80 of the wafer 44 will be from the lamps 51 that comprise the zone 55. Simultaneously, the lower surface 82 of the wafer receives heat in the form of convection from the flow of the heat-conductive gas within the chamber 20 and also, to a lesser extent, in the form of radiation both from lamps surrounding the reaction chamber and from the heated susceptor 42. The heat received from the susceptor 42 is sometimes referred to as "conduction" if the gap between the wafer 44 and the susceptor is less than the mean free path of molecules in the gas between the wafer and the susceptor. As mentioned above, the gap between the upper surface 45 of the susceptor shoulder 47 and the lower surface 82 of the wafer 44 is preferably very small. The small gap between the susceptor 42 and wafer 44 reduces the heat flux path therebetween. This in turn accentuates heat absorption received by the lower surface 82 of the wafer 44. Preferably, the amount of heat absorbed by the upper surface 80 of the wafer 44 is approximately equal to (e.g., within 30% and more preferably within 10% of) the amount of heat absorbed by the lower surface 82. This reduces the risk that the wafer will curl while held by the Bernoulli wand 76.

The primary reason for raising the susceptor 42 upon wafer load is to shorten the time required for the wafer temperature to rise to the level at which the wafer 44 can absorb radiation, typically about 400° C. At low temperatures, the wafer is generally transparent to radiation, due to a very small absorptivity of the wafer. The absorptivity rises along with the wafer temperature. Therefore, when the wafer is initially loaded, the heat received by the upper surface 80 of the wafer (mostly radiation) is much less than the heat received by the lower surface 82. As the wafer temperature rises, mainly due to heat flow from the susceptor 42, the heat received by the upper surface 80 increases. Generally, when the wafer temperature is approximately 400° C., the heat received by the upper surface 80 of the wafer 44 is only about 20% of the heat received by the lower surface 82. When the wafer temperature is about 400–700° C., the heat received by the upper surface 80 and the lower surface 82 is about equal. When the wafer temperature is about 700–1200° C., the heat received by the upper surface 80 is about 150–200% of the heat received by the lower surface 82.

The preferred time period during which the wafer 44 is held in the position shown in FIG. 4 (the "preheat time period") depends upon the temperature of the susceptor 42 and the size of the wafer. As explained above, the wafer preheat time period is preferably chosen so that the wafer temperature rises to a level sufficient to substantially prevent or significantly reduce the likelihood of wafer curl or pop when the wafer is subsequently lowered into direct contact with the susceptor 42. For a wafer having a diameter of 200 mm and a thickness of 750 $\mu$m loaded onto a susceptor having a temperature of 900° C., the wafer preheat time period is preferably about 2.0–4.0 seconds, more preferably about 3.0–3.5 seconds, and even more preferably about 3.5 seconds. For a wafer having a diameter of 300 mm and a thickness of 750 $\mu$m loaded onto a susceptor having a temperature of 900° C., the wafer preheat time period is preferably about 5–9 seconds, more preferably about 6–8 seconds, and more preferably about 7 seconds.

Figure 5:
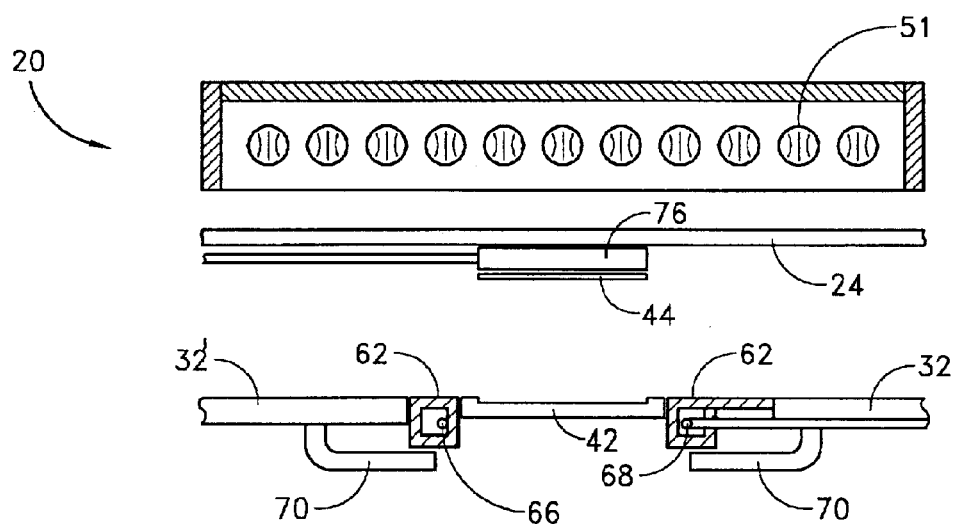
Figure 7:
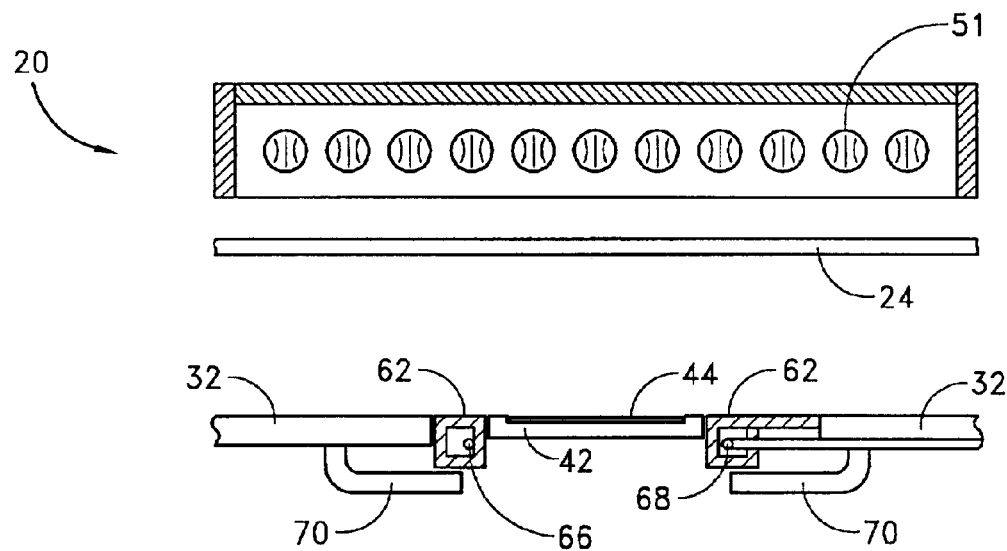

With reference to FIG. 5, after the wafer 44 is held in the position shown in FIG. 4 for a desired preheat time period, the susceptor 42 (or, if the susceptor comprises multiple portions, the vertically movable portion of the susceptor) is then preferably moved back to its lowered position. The gas flow within the Bernoulli wand 76 is then turned off, permitting the wafer 44 to drop onto the lowered susceptor 42, as shown in FIG. 6. The skilled artisan will understand that the process steps depicted in FIGS. 5 and 6 can be reversed. In other words, the wand gas can be turned off to drop the wafer while the susceptor 42 (or the vertically movable portion thereof) is still in its raised position shown in FIG. 4. The susceptor 42 (or the vertically movable portion thereof) can then be moved to its lowered position while the wafer 44 is resting thereon. After the wafer is loaded into direct contact with the susceptor 42, the heat-conductive gas is preferably reduced to the second or reduced flow rate, as explained above, and the temperature control of the reaction chamber is preferably switched from fixed power mode back to closed loop temperature control. After the wand gas is turned off, the wand 76 is retracted from the chamber 20, as shown in FIG. 7. The wafer 44 is now loaded and ready for CVD processing.

The wafer-loading methods of the present invention result in improved preheating of the wafer before it is brought into contact with the wafer holder. As a result, the risk of thermal shock to the wafer is substantially reduced, regardless of the geometry of the susceptor. In other words, susceptors configured to have a greater surface area of contact between the wafer and the susceptor do not pose a significantly greater risk of inducing thermal shock to the wafer. Thus, a greater variety of susceptors can be used. The present invention helps to prevent undesired effects of thermal shock, including damage to the wafer topside, particle generation within the reaction chamber, and damage to end effector equipment.

The methods of the present invention can also be used for many different types of wafers, including wafers of different sizes and device types. For example, the methods of the present invention permit the use of wafers having diameters of 150 mm, 200 mm, and 300 mm, as well as various different wafer thicknesses. Also, wafers of different dopant types can be loaded according to the methods of the invention.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Further, the various features of this invention can be used alone, or in combination with other features of this invention other than as expressly described above. Thus, it is intended that the scope of the present invention herein disclosed should not be limited by the particular disclosed embodiments described above, but should be determined only by a fair reading of the claims that follow.

We claim:

1. A method of loading a wafer onto a wafer holder within a reaction chamber, the wafer holder initially having a higher temperature than the wafer, at least a portion of the wafer holder having a lowered position and a raised position, an upper surface of the at least a portion of the wafer holder having a surface area greater than 25% of the surface area of a lower surface of the wafer, the method comprising:
   providing a flow of heat-conductive gas within the reaction chamber;
   moving said portion of the wafer holder to its raised position;
   inserting the wafer into the reaction chamber;
   holding the wafer spaced above said portion of the wafer holder in its raised position while the heat-conductive gas flows within the reaction chamber, for a time period sufficient to permit the wafer temperature to increase to a level sufficient to substantially reduce the likelihood that the wafer will curl or pop if the wafer is lowered onto the at least a portion of the wafer holder;
   after said time period, lowering said portion to its lowered position and lowering the wafer onto said wafer holder; and
   processing the wafer on the wafer holder while in its lowered position.

2. The method of claim 1, wherein lowering the wafer onto said portion of the wafer holder is conducted before lowering said portion of the wafer holder to its lowered position.

3. The method of claim 1, wherein lowering said portion of the wafer holder to its lowered position is conducted before lowering the wafer onto the wafer holder.

4. The method of claim 1, further comprising providing radiant heat to the reaction chamber from at least one lamp above the reaction chamber.

5. The method of claim 4, wherein a bank of lamps is provided above the reaction chamber, and providing radiant heat comprises providing fixed power to the bank of lamps above the reaction chamber.

6. The method of claim 4, wherein a bank of lamps is provided above the reaction chamber, the method further comprising:
   before said time period, switching a temperature control of the reaction chamber from closed loop temperature control to fixed power to one or more of the bank of lamps; and
   after said time period, switching the temperature control of the reaction chamber from fixed power to one or more of the bank of lamps to closed loop temperature control.

7. The method of claim 1, wherein holding the wafer spaced above said portion of the wafer holder comprises holding the wafer such that a gap of less than 1.300 mm is maintained between a top-most portion of the upper surface of said portion of the wafer holder and the lower surface of the wafer.

8. The method of claim 7, wherein holding the wafer spaced above said portion of the wafer holder comprises holding the wafer such that a gap of less than 1.143 mm is maintained between the upper surface of said portion of the wafer holder and the lower surface of the wafer.

9. The method of claim 1, wherein lowering the wafer onto the wafer holder comprises dropping the wafer onto said portion of the wafer holder.

10. The method of claim 1, wherein holding the wafer comprises holding the wafer with a robotic end-effector, and wherein lowering the wafer comprises releasing the wafer from the end-effector and permitting the wafer to drop.

11. The method of claim 10, wherein said end-effector comprises a Bernoulli wand.

12. The method of claim 1, wherein inserting the wafer into the reaction chamber comprises:
   holding the wafer with a Bernoulli wand; and
   moving the wand into the reaction chamber so that the wafer is held above said portion of the wafer holder in its raised position.

13. The method of claim 1, wherein providing a flow of heat-conductive gas comprises providing a flow of gas at a first flow rate prior to lowering the wafer onto the wafer holder and at a second flow rate after lowering the wafer the wafer holder, the second flow rate being at least 50% less than the first flow rate.

14. The method of claim 1, wherein providing a flow of heat-conductive gas comprises providing a flow of gas at a flow rate of 40–60 slm.

15. The method of claim 14, wherein the heat-conductive gas comprises hydrogen gas.

16. The method of claim 1, wherein the wafer holder has a temperature of approximately 900° C. during said step of inserting said wafer into said reaction chamber, said wafer being a 200 mm wafer, said time period being within the range of about 2.0–4.0 seconds.

17. The method of claim 1, wherein the wafer holder has a temperature of approximately 900° C. during said step of inserting said wafer into said reaction chamber, said wafer being a 300 mm wafer, said time period being within the range of about 5–9 seconds.

18. The method of claim 1, wherein walls of said reaction chamber, including the upper wall, are formed of quartz.

19. The method of claim 1, wherein the wafer holder comprises a susceptor.

20. The method of claim 1, wherein the wafer has an upper surface, and wherein during the step of holding the wafer spaced above said portion of the wafer holder, the amount of heat received by the lower surface of the wafer is within about 30% of the amount of heat received by the upper surface of the wafer.

21. The method of claim 1, wherein a recess is formed in an upper surface of the wafer holder, said recess sized and configured to closely receive said wafer.

22. The method of claim 1, wherein a plurality of grooves are formed in an upper surface of the wafer holder, the grooves configured to permit gas flow between the wafer and the wafer holder when the wafer is in contact with the wafer holder.

23. The method of claim 1, wherein the wafer holder comprises a single piece.

24. A method of loading a wafer onto a wafer holder within a reaction chamber, the wafer holder initially having a higher temperature than the wafer, comprising:

providing radiant heat to the reaction chamber from at least one lamp above the reaction chamber;

providing a flow of heat-conductive gas within the reaction chamber, at a first flow rate;

inserting a wafer into the reaction chamber;

holding the wafer above the wafer holder while the radiant heat is being provided to the reaction chamber and while the heat-conductive gas flows within the reaction chamber between the wafer and the wafer holder, for a time period sufficient to substantially reduce the likelihood of wafer curl or pop if the wafer is loaded into direct contact with the wafer holder;

lowering the wafer onto the wafer holder; and after the wafer is lowered onto the wafer holder, continuing but decreasing the flow of the heat-conductive gas to a second flow rate at least 50% less than the first flow rate.

25. The method of claim 24, wherein said heat-conductive gas is hydrogen gas.

26. The method of claim 24, wherein the decreasing the flow of the heat-conductive gas to the second flow rate is performed before CVD processing.

27. A method of loading a wafer onto a wafer holder within a reaction chamber, the wafer holder initially having a higher temperature than the wafer, comprising:

providing power at a fixed rate to an array of lamps generally centered above the reaction chamber and above the wafer holder, while simultaneously providing power at a substantially lower rate to other lamps outside of the reaction chamber, said lamps transmitting radiant heat to the reaction chamber;

providing a flow of heat-conductive gas within the reaction chamber;

inserting a wafer into the reaction chamber;

holding the wafer above the wafer holder during said steps of providing power and providing a flow of heat-conductive gas, for a time period sufficient to permit the wafer temperature to increase to a level sufficient to substantially reduce the likelihood of thermal shock to the wafer if the wafer is lowered onto the wafer holder; and lowering the wafer onto the wafer holder.

28. The method of claim 27, wherein at least a portion of the wafer holder has a lowered position and a raised position, an upper surface of the at least a portion of the wafer holder having a surface area greater than 25% of the surface area of a lower surface of the wafer, the method further comprising:

prior to inserting the wafer into the reaction chamber, moving the at least a portion of the wafer holder to its raised position;

maintaining the at least a portion of the wafer holder in its raised position during said time period; and after said time period, lowering the at least a portion of the wafer holder to its lowered position;

wherein the wafer is within 1.300 mm of the at least a portion of the wafer holder while said at least a portion of the wafer holder is maintained in its raised position.

* * * * *